(12) United States Patent
Suzuki et al.

(10) Patent No.: US 6,608,256 B2
(45) Date of Patent: Aug. 19, 2003

(54) FLAT CABLE

(75) Inventors: Yutaka Suzuki, Tokyo (JP); Takayoshi Ono, Tokyo (JP); Mioko Kamikawa, Tokyo (JP); Kikunori Yoshihara, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/160,130

(22) Filed: May 31, 2002

(65) Prior Publication Data

US 2003/0024729 A1 Feb. 6, 2003

(30) Foreign Application Priority Data

Jun. 1, 2001 (JP) ........................... 2001-166413

(51) Int. Cl.$^7$ ................................. H01B 7/08
(52) U.S. Cl. ...................... 174/117 F; 174/110 SR
(58) Field of Search ................ 174/117 F, 117 FF, 174/110 SR; 428/383, 623, 625, 626

(56) References Cited

U.S. PATENT DOCUMENTS 6,242,097 B1 * 6/2001 Nishiguchi et al. ......... 428/383

FOREIGN PATENT DOCUMENTS

| EP | 0 099 252 A2 | 1/1984 |
| WO | WO 88/09041 | 11/1988 |
| WO | WO 93/08234 | 4/1993 |
| WO | WO 98/52199 | 11/1998 |

OTHER PUBLICATIONS

English Abstract of JP-A-9-221642, Aug. 1997.
English Abstract of JP-A-8-60108, Mar. 1996.
English Abstract of JP-A-2000-80223, Mar. 2000.
English Abstract of JP-A-11-53946, Feb. 1999.

* cited by examiner

*Primary Examiner*—Chau N. Nguyen
(74) *Attorney, Agent, or Firm*—Knobbe Martens Olson & Bear LLP (57) ABSTRACT

A flat cable, which has an insulating coating composed of a polyester resin composition, the composition containing:

(A) 100 parts by weight of a thermoplastic aromatic polyester;

(B) 10 to 120 parts by weight of a polyester block copolymer composed of: 20 to 80 wt % of a hard segment whose main component is poly (tetramethylene terephthalate) that is composed of an acid component in which terephthalic acid occupies 60 mole % or more and a diol component in which tetramethylene glycol occupies 60 mole % or more; and 80 to 20 wt % of a soft segment whose main component is a polyester that is composed of an acid component in which an aromatic dicarboxylic acid occupies 60 mole % or more and a diol component of a long-chain diol having 5 to 12 carbon atoms; and (C) 1 to 50 parts by weight of an olefin-acrylate copolymer modified by a glycidyl compound.

4 Claims, 1 Drawing Sheet

FLAT CABLE

FIELD

The present invention relates to a flat cable.

BACKGROUND

As compared with an electric wire having a round section, a flexible flat cable (hereinafter it may be abbreviated to FFC) refers to an electric wire composed of a plurality of conductors disposed parallel in the longitudinal direction, which are insulated and coated in an electrically independent state. The FFC is characterized by excellent flexibility, capability for being bent, and easy formation of multiple cores. Further, since the FFC is thin and can minimize the space occupied by the wire itself, it attracts attention as a wiring material to be used in automobiles and appliances, which wiring is advanced in the multi-core structure due to the recent complication in control.

The FFC using flat conductors having a rectangular sectional shape, in particular, is characterized by being high in heat dissipation, if the conductor sectional area is the same, because the surface area of the flat conductor is wider than that of a round-section conductor. In the case of multi-core FFC, the smaller the thickness of the flat conductor as compared with its width is, the better and more remarkable the heat dissipation property is.

Generally, the allowable current of an electric wire is determined by the degree of temperature rise when power is fed, the ambient temperature, and the heat resistance temperature of the coating material. The allowable current value of an electric wire is judged to be larger when the degree of temperature rise when power is fed is smaller, the ambient temperature is lower, and/or the heat resistance temperature of the coating material is higher.

Usually, an electric wire is protected by actuation of a fuse or circuit breaker to shut down the current if a large current flows, so a large current will not flow for a long period of time. Therefore, the heat resistance required in such a coating material means heat resistance in a very short period of time (about 500 to 1000 seconds), and it does not mean a long-term characteristic, such as resistance to aging by heat.

If heat resistance in a short period of time of the coating material can be enhanced, a large current can flow, which contributes greatly to saving of conductors to be used in wiring and reduction of weight.

Comparing the FFC using flat conductors and an ordinary round-section electric wire using round-section conductors, if the coating materials are the same and the sectional areas of conductors are the same, the flat conductor FFC can release the heat generated by power feeding more smoothly, and the degree of temperature rise of conductors is smaller, so that a larger allowable current may be determined. In other words, if the allowable current values are the same, the amount of conductors to be used can be lessened in the FFC than in the round-section electric wire, and the weight of the wiring material within the appliance can be reduced advantageously.

As the FFC producing method, the laminate method and extrusion molding method are representative. In the laminate method, conductors are held with films of insulators from both above and beneath, and passed through heated rolls, and the upper and lower films and conductors are integrated by adhering or fusing. In ordinary manufacturing, use is made of an adhesive layer that is applied on the surface of a very thin film made of polyethylene terephthalate or the like, or use is made of these layer and film that are co-extruded.

In the extrusion molding method, for example, a polyamide, a polyolefin, or a polyamide polymer alloy is used as a coating material.

The laminate-type FFC is accompanied with such problem that the speed of manufacturing line is very slow, and that it is hence low in productivity. This is because heat must be transmitted from the heated roll to the adhesive layer held between films, by way of the films, which are insulating and very poor in heat transfer, and it takes time to transfer enough heat to the adhesive layer. The adhesive layer is required to be fused easily by heat. Therefore, it is difficult to expect sufficient heat resistance in the FFC produced by such a laminate method using heat.

On the other hand, FFC made by the extrusion molding method is advantageous as compared with that of the laminate type in heat resistance, because it has no adhesive layer. Extrusion coating materials include polyvinyl chloride (hereinafter it may be abbreviated to PVC), polyamide, and polyolefin, as typical examples.

Polyamide is generally very high in moisture absorption, and it is accompanied with the problem of significant change in mechanical properties and electrical properties between the dry state and the moist state. An example of a polyamide relatively low in moisture absorption, and evaluated as an electric wire coating material, is nylon 12. However, nylon 12 has a low melting point, and it fuses at about 180° C. On the other hand, PVC derivative coating materials used hitherto hardly deteriorate at this level of temperature, if exposed for a short period of time, and they can maintain performance. Therefore, if nylon 12 is used as the coating material for FFC, a saving effect of conductors to be used is hardly obtained as compared with PVC, from the viewpoint of improving the heat resistance temperature.

On the other hand, polyolefin is low in moisture absorption, and it is inexpensive and excellent in extrusion molding performance, but it is low in heat resistance; and, for example, polypropylene begins to soften at about 150° C. Therefore, polyolefin also does not contribute to saving of conductors to be used, from the viewpoint of improving the heat resistance temperature of the coating material.

Further, the PVC has a high content of halogen-group chlorine, and it is high in environmental load that is the problem.

Accordingly, to minimize the sectional area of conductors without lowering the allowable current value, it is required to enhance the heat resistance of the coating material sufficiently. A thermoplastic aromatic polyester is known as a relatively inexpensive material having a high heat resistance temperature. Representative examples of ordinary thermoplastic aromatic polyester to be used include polyethylene terephthalate (hereinafter abbreviated to PET) and polytetramethylene terephthalate (hereinafter abbreviated to PBT). The PET film used in laminate-type FFC has already been drawn in the film extrusion molding process; it has a high degree of crystallization; it is very uniform and homogeneous in the crystal size; and it is tough and high in the level of resistance to the hydrolysis that is evaluated in the present invention. However, in the case of the extrusion molding method, since there is no drawing process, the degree of crystallization is insufficient in both PET and PBT, and the crystal size is not uniform, and hence it is brittle and inferior in flexibility, and is extremely lowered in resistance to the hydrolysis that is evaluated in the present invention. Therefore, thermoplastic aromatic polyester resin has been hardly used so far as a coating material preferable for extrusion molding of FFC.

SUMMARY

The present invention is a flat cable that has an insulating coating composed of a polyester resin composition, which composition comprises:

(A) 100 parts by weight of a thermoplastic aromatic polyester;

(B) 10 to 120 parts by weight of a polyester block copolymer composed of: 20 to 80 wt % of a hard segment whose main component is poly(tetramethylene terephthalate) that is composed of an acid component in which terephthalic acid occupies 60 mole % or more and a diol component in which tetramethylene glycol occupies 60 mole % or more; and 80 to 20 wt % of a soft segment whose main component is a polyester that is composed of an acid component in which an aromatic dicarboxylic acid occupies 60 mole % or more and a diol component of a long-chain diol having 5 to 12 carbon atoms; and (C) 1 to 50 parts by weight of an olefin-acrylate copolymer modified by a glycidyl compound.

Other and further features and advantages of the present invention will appear more fully from the following description, taken in connection with the accompanying drawings.

DETAILED DESCRIPTION

According to the present invention, there is provided the following means:

(1) A flat cable, having an insulating coating composed of a polyester resin composition, the composition comprising:
 (A) 100 parts by weight of a thermoplastic aromatic polyester;
 (B) 10 to 120 parts by weight of a polyester block copolymer composed of: 20 to 80 wt % of a hard segment whose main component is poly(tetramethylene terephthalate) that is composed of an acid component in which terephthalic acid occupies 60 mole % or more and a diol component in which tetramethylene glycol occupies 60 mole % or more; and 80 to 20 wt % of a soft segment whose main component is a polyester that is composed of an acid component in which an aromatic dicarboxylic acid occupies 60 mole % or more and a diol component of a long-chain diol having 5 to 12 carbon atoms; and
 (C) 1 to 50 parts by weight of an olefin-acrylate copolymer modified by a glycidyl compound;

(2) The flat cable according to item (1), wherein the polyester resin composition further comprises:
 (D) 1 to 100 parts by weight of a phosphorus derivative flame retardant; and (3) The flat cable according to item (1) or (2), wherein the polyester resin composition further comprises:

(E) 0.01 to 5 parts by weight of a polycarbodiimide compound.

The present invention is explained in detail below.

In the flat cable of the present invention, use is made of a coating material having the composition mentioned in the item (1) above in the use in which flame (fire) retardancy is not required.

Further, in the use in which a high flame retardancy is required such as a wiring in automotives, to realize a higher flame retardancy level (for example, horizontal flame retardancy in JASO D 611), preferably, use is made of the flat cable having an insulating coating composed of the polyester resin composition further comprising 1 to 100 parts by weight of a phosphorus derivative flame retardant (D).

Further, in the use in which a high resistance to hydrolysis is required, preferably, use is made of the flat cable having an insulating coating composed of the polyester resin composition further comprising 0.01 to 5 parts by weight of a polycarbodiimide compound (E).

{Thermoplastic Aromatic Polyester (A)}

The thermoplastic aromatic polyester (A) is a polyester composed of a dicarboxylic acid component and a diol component, using an aromatic dicarboxylic acid as a main dicarboxylic acid component, and an aliphatic diol having 2 to 10 carbon atoms as a main diol component. Preferably, 80 mole % or more, and more preferably 90 mole % or more of the dicarboxylic acid component is the aromatic dicarboxylic acid component. Preferably, 80 mole % or more, and more preferably 90 mole % or more of the diol component is the aliphatic diol having 2 to 10 carbon atoms.

Preferred examples of the aromatic dicarboxylic acid include terephthalic acid, isophthalic acid, phthalic acid, methylterephthalic acid, methylisophthalic acid, and 2,6-naphthalenedicarboxylic acid. These may be used either alone or in combination of two or more kinds. Examples of the secondary dicarboxylic acid to be used other than the aromatic dicarboxylic acid include, for example, aliphatic- or alicyclic-dicarboxylic acids, such as adipic acid, sebacic acid, decanecarboxylic acid, azelaic acid, dodecanedicarboxylic acid, and cyclohexanedicarboxylic acid.

Examples of the aliphatic diol having 2 to 10 carbon atoms include aliphatic diols, such as ethylene glycol, trimethylene glycol, tetramethylene glycol, hexamethylene glycol, and neopentyl glycol, and alicyclic diols such as 1,4-cyclohexanedimethanol. These aliphatic diols and alicyclic diols may be used either alone or in combination of two or more kinds. Examples of the secondary glycol to be used other than the aliphatic diol with 2 to 10 carbon atoms include, for example, p,p'-dihydroxyethoxy bisphenol A, and polyoxyethylene glycol.

As the thermoplastic aromatic polyester (A), for example, ethylene terephthalate, trimethylene terephthalate, tetramethyleneterephthalate, ethylene-2,6-naphthalanedicarboxylate, or tetramethylene-2,6-naphthalenedicarboxylate is preferably used as a main repeating unit of polyester. The main repeating unit means a repeating unit occupying 80 mole % or more of all the repeating units. A further preferred thermoplastic aromatic polyester (A) is a polyester using ethylene terephthalate, trimethyleneterephthalate, or tetramethyleneterephthalate as the main repeating unit, and most preferably tetramethyleneterephthalate is used as the main repeating unit of the polyester.

The thermoplastic aromatic polyester (A) used in the present invention preferably contain the end carboxyl group measured in benzyl alcohol at 35° C., in an amount of less than 60 eq/ton, and more preferably the end carboxy group in an amount of less than 25 eq/ton. If the end carboxyl group is contained too much, desired resistance to hydrolysis may not be obtained.

In the thermoplastic aromatic polyester (A) used in the present invention, the intrinsic viscosity measured in orthochlorophenol at 35° C. is preferred to be in a range of 0.5 to 1.4 dl/g. In this range of intrinsic viscosity, a polyester resin composition of favorable properties in both mechanical strength and flowability can be obtained, and excellent workability can be achieved in the extrusion coating process.

{Polyester Block Copolymer (B)}

The polyester block copolymer (B) is composed of: 20 to 80 wt % of a hard segment whose main component is poly(tetramethylene terephthalate) that is composed of an acid component in which terephthalic acid occupies 60 mole % or more and a diol component in which tetramethylene glycol occupies 60 mole % or more; and 80 to 20 wt % of a soft segment whose main component is a polyester that is composed of an acid component in which an aromatic dicarboxylic acid occupies 60 mole % or more and a diol component of a long-chain diol having 5 to 12 carbon atoms.

The hard segment is mainly composed of poly (tetramethylene terephthalate), as a main component, which may be made by copolymerization with an acid other than terephthalic acid, such as an aromatic dicarboxylic acid containing a benzene ring or naphthalene ring, and an aliphatic dicarboxylic acid having 4 to 12 carbon atoms, or a diol other than tetramethylene glycol, such as an aliphatic diol having 2 to 12 carbon atoms, or an alicyclic diol (e.g. cyclohexane dimethanol). These copolymerization components may be used either alone or in combination of two or more kinds. The copolymerization ratio is generally less than 40 mole %, and preferably less than 30 mole %, of the total dicarboxylic acid or diol.

On the other hand, as the main component of the soft segment, use is made of a polyester mainly composed of an aromatic dicarboxylic acid and a long-chain diol having 5 to 12 carbon atoms. Examples of the aromatic dicarboxylic acid include phthalic acid, isophthalic acid, terephthalic acid, and naphthalene dicarboxylic acid, and, in particular, non-linear dicarboxylic acids, such as phthalic acid and isophthalic acid, are preferred. Examples of the long-chain diol include hexamethylene glycol, decamethylene glycol, 3-methylpentane diol, 2-methyloctamethylene diol, and triethylene glycol. In the soft segment, the polymer composed of units for composing the soft segment is preferred to be 100° C. or less and more preferably 50° C. or less, in melting point, or is preferred to be amorphous.

The soft segment may be made by copolymerization with an aliphatic or alicyclic dicarboxylic acid other than the above aromatic dicarboxylic acid, or a short-chain diol. The copolymerization ratio is generally less than 40 mole %, and preferably less than 30 mole %, of the dicarboxylic acid component and diol component. If this ratio is too much, a problem may occur in the resistance to hydrolysis. It may be also copolymerized with an aliphatic polyether, such as poly(tetramethylene glycol) in an amount of 30 wt % or less of the total weight of the polyester block copolymer. If the amount is too much, it may spoil the resistance to oxidation which is one of the merits of this polyester block copolymer.

Examples of the copolymerizable aliphatic dicarboxylic acid or alicyclic dicarboxylic acid that can be used herein include a straight-chain dicarboxylic acid having 4 to 12 carbon atoms, in particular, a straight-chain dicarboxylic acid having 8 to 12 carbon atoms, and cyclohexane dicarboxylic acid. Examples of the copolymerizable short-chain diol include a straight-chain aliphatic diol having 2 to 4 carbon atoms, and diethylene glycol. As poly (tetramethylene glycol), a compound of relatively low in molecular weight can be preferably used, such as molecular weight of 1200 or less, or more preferably 1000 or less.

In the polyester block copolymer (B), the ratio of the hard segment and the soft segment is 20:80 to 80:20 or preferably 25:75 to 45:55, in terms of ratio by weight. If the hard segment in the polyester block copolymer is contained too much, the flexibility is insufficient, or if the soft segment is too much, the crystallinity is lowered, and the resultant coating material may have an adhesive property when winding up after coating.

The segment length of the soft segment and the hard segment of the polyester block copolymer is expressed by molecular weight, and it is generally about 500 to 7000, preferably 800 to 5000. It is hard to measure the segment length directly, but it may be estimated by using Florey's formula from the composition of the polyesters for each composing the soft segment and the hard segment, the melting point of the polyester of components for composing the hard segment, and the melting point of the obtained polyester block copolymer.

The polyester block copolymer (B) can be produced, for example, in a method of producing polyesters which are used as components for composing the hard segment and the soft segment, and fusing and mixing until the melting point may be lower by 2 to 40° C. than that of the polyester for composing the hard segment. Since the melting point varies with the mixing temperature and time, it is preferred to inactivate the catalyst to be used, by adding a catalyst-inactivator, such as oxyphosphoric acid, when reaching the desired melting point.

As the polyester block copolymer (B), preferably, a compound of which intrinsic viscosity as measured in 35° C. orthochlorophenol is 0.6 or more, or more preferably 0.8 to 1.5 is used. If the intrinsic viscosity is too low, the mechanical strength is lowered, and it is hard to handle. If the intrinsic viscosity is too high, the workability becomes poor in the extrusion coating process.

The polyester block copolymer (B) is blended in a range of 10 to 120 parts by weight, to 100 parts by weight of the thermoplastic aromatic polyester (A). If less than 10 parts by weight, excellent properties are not obtained in the resistance to hydrolysis or resistance to aging by heat in the present invention, and if exceeding 120 parts by weight, the resistance to wear is lowered significantly.

{Olefin-acrylate Copolymer Modified by a Glycidyl Compound (C)}

The above-mentioned copolymer is composed, for example, of at least one olefin, at least one of an alkyl (having 1 to 10 carbon atoms) or cycloalky (having 3 to 10 carbon atoms) ester of (meth)acrylic acid, and at least one glycidyl compound. The copolymer is preferably a random copolymer in which each of the above copolymer components are copolymerized randomly.

Examples of the olefin that can be used as a constituent component of the above copolymer includes an olefin having 2 to 5 carbon atoms. Among these, in particular, ethylene and propylene are preferred.

Specific examples of the (cyclo)alkyl(meth)acrylate that can be used as a constituent component of the copolymer include methyl methacrylate, methyl acrylate, ethyl acrylate, n-butyl acrylate, isobutyl acrylate, and 2-ethylhexyl acrylate. Among these, in particular, methyl acrylate is used preferably.

Examples of the glycidyl compound that can be used as a constituent component of the copolymer include aliphatic glycidyl esters, allyl glycidyl ether, vinyl glycidyl ether, glycidyl maleate, glycidyl itaconate, glycidyl acrylate, glycidyl methacrylate, alicyclic glycidyl esters, 2-cyclohexen-1-glycidyl ether, cyclohexen-4,5-diglycidyl carboxylate, cyclohexen-4-glycidyl carboxylate, 5-norbornene-2-methyl-2-glycidyl carboxylate, and endosis-bicyclo(2,2,1)-5-hepten-2,3-diglycidyl carboxylate. Among these, in particular, an aliphatic glycidyl ester is used preferably.

The olefin-acrylate copolymer modified by a glycidyl compound (C) in the present invention preferably contains 94 to 50 wt % of a constituent component made from olefin in terms of a monomer converted amount, 5 to 35 wt % of a constituent component made from (cyclo)alkyl) (meth)acrylate in terms of a monomer converted amount, and 1 to 15 wt % of a constituent component made from a glycidyl compound in terms of a monomer converted amount.

The olefin-acrylate copolymer modified by a glycidyl compound (C) is, for example, one having a repeating unit as represented by the following formula (1):

(1)

wherein $R^1$ represents a hydrogen atom or a methyl group, $R^2$ represents an alkyl group having 1 to 10 carbon atoms or a cycloalkyl group having 3 to 10 carbon atoms; and k, i, and j each independently are a positive integer.

The olefin component has a feature of providing with mechanical strength or forming workability by crystallization, the (cyclo)alkyl(meth)acrylate component has a feature of increasing the flexibility of the resultant copolymer by lowering the degree of crystallinity, and the glycidyl compound component has a feature of enhancing the reactivity with other compound having a functional group capable of reacting with an epoxy group. If the olefin component is contained by more than 94 wt %, the flexibility as the copolymer may be lost; while if less than 50 wt %, the mechanical strength may be lowered, and neither case is preferable. If the (cyclo)alkyl(meth)acrylate component is contained by more than 35 wt %, the mechanical strength as the copolymer may be lowered; while if less than 5 wt %, it may be difficult to give a preferred flexibility in some cases. The glycidyl compound component has an effect of reacting with the thermoplastic aromatic polyester, in particular, to enhance the compatibility. Therefore, if the glycidyl compound component is contained in an amount of less than 1 wt %, the compatibility may be insufficient; while if exceeding 15 wt %, the melt viscosity may be increased extremely due to the excess reaction between a terminal group (a carboxyl group) of the thermoplastic aromatic polyester and an epoxy group (a glycidyl group) derived from the glycidyl compound component, and it is not preferred from the viewpoint of extrusion processing.

The olefin-acrylate copolymer modified by a glycidyl compound (C) is blended within the range of 1 to 50 parts by weight, and preferably 1 to 30 parts by weight, to 100 parts by weight of the thermoplastic aromatic polyester (A). If exceeding 50 parts by weight, the resistance to aging by heat is lowered, and it is not preferred as a coating material. If less than 1 part by weight, the melt viscosity and surface tension in extrusion process are not improved, and the improving effect in the extrusion-coating property is not obtained.

{Phosphorus Derivative Flame Retardant (D)}

When a particularly high degree of flame retardancy is required in an electric wire, a flame retardant of a phosphorus compound may be blended in the composition to be used in the present invention. The phosphorus derivative flame retardant (D) is not particularly limited, as far as it is a compound having a phosphorus atom and is excellent in thermal stability. Among these, an aromatic phosphate, a polyphosphoric acid compound, and red phosphorus may be mentioned as the example.

An example of an aromatic phosphate ester has a structure as represented by formula (2):

(2)

wherein $R^3$, $R^4$, $R^5$, $R^6$, $R^7$, $R^8$, $R^9$ and $R^{10}$ each independently represent a hydrogen atom or an alkyl group having 1 to 6 carbon atoms, X represents a divalent organic group; and the divalent organic group means a divalent group formed by removing one hydrogen atom bonded to a carbon atom from an alkyl group, cycloalkyl group, aryl group, or the like, specifically preferable examples include a group removing two hydrogen atoms bonded to carbon from compounds such as hydroquinone, resorcinol, diphenol methane, diphenol dimethyl methane, dihydroxy diphenyl, p,p'-dihydroxydiphenylsulfone, and dihydroxynathphalene; and m is 0 or an integer of 1 to 4, preferably 1 to 3, more preferably 1.

Examples of the polyphosphoric compound include, for example, polyphosphoric acids and melamine compounds, more specifically melamine polyphosphate, melam polyphosphate, and melem polyphosphate. Ammonium polyphosphate may be also used preferably. The preferred average particle diameter is 0.05 to 100 μm, more preferably 0.1 to 80 μm.

As the red phosphorus, a coated red phosphorus powder is preferably used, which is composed of spherical red phosphorus free from a fracture surface, having a coating layer of cured resin, directly obtained by conversion process of yellow phosphorus not requiring grinding. It is preferred to be coated with at least one cured resin selected from the group consisting of phenol resins, epoxy resins, unsaturated polyester resins, melamine resins, urea resins, and aniline resins. The coating amount of the cured resin is preferred to be 1 to 35 parts by weight, to 100 parts by weight of red phosphorus.

The coated red phosphorus powder is preferred to further contain, by dispersing, at least one inorganic compound selected from the group consisting of hydroxides or oxides of aluminum, magnesium, zinc, copper, and titanium, in the cured resin of the coating film. It is further preferred to contain such an inorganic compound brought into contact with red phosphorus beneath the coating film of the cured resin.

The average particle diameter of red phosphorus powder is preferably in a range of 0.5 to 40 μm, and more preferably in a range of 1 to 35 μm. If the average particle size is too small, it is not preferred from the viewpoint of uniformity of dispersion. On the other hand, if too large, it is not preferred because the mechanical characteristics and flame retardancy are lowered.

The coated red phosphorus powder is extremely improved, as compared with red phosphorus alone, in the aspects of handling and safety. In this connection, in order to achieve a higher safety when using the coated red phosphorus powder in the present invention, it is preferred to use as master pellets preliminarily fused and kneaded with a thermoplastic resin. In this case, as the thermoplastic resin for use in fusing and kneading, examples include polyethylenes, polypropylenes, EPDM, ethylene ethyl acrylate, ethylene methyl acrylate, thermoplastic polyesters, polyamides, and aromatic polycarbonates. Generally, a polypropylene, a polyester resin, or an aromatic polycarbonate may be used preferably.

The content of the coated red phosphorus powder in master pellets varies depending on the kind of the thermoplastic resin to be used together, but it is generally in a range of 10 to 50 wt %, preferably. If the content is too small, the amount of master pellets to be added increases relatively, and if too large, it is hard to form master pellets, and the safety may be lowered.

The phosphorus derivative flame retardant (D) that can be used in the present invention may be used alone or in combination of two or more types of the above. In particular, an aromatic phosphate ester is preferred.

The phosphorus derivative flame retardant (D) is contained preferably in an amount of 1 to 100 parts by weight, more preferably 1 to 50 parts by weight, to 100 parts by weight of the thermoplastic aromatic polyester (A). If the amount of (D) is too small, higher degree of flame retardancy cannot be obtained, and if too large, mechanical properties may be spoiled.

{Polycarbodiimide Compound (E)}

The polycarbodiimide compound (E) is a compound having at least two carbodiimide bonds in one molecule. In particular, to obtain a favorable resistance to hydrolysis, the polycarbodiimide compound (E) is preferred to have the average degree of polymerization of 2 to 30. If the average degree of polymerization is too small, bleed-out and other problems are likely to occur, or if the average degree of polymerization is too large, problems occur in dispersion or the like in kneading process.

The polycarbodiimide compound (E) is preferably a polycarbodiimide obtainable by reaction of a diisocyanate compound, such as an aromatic diisocyanate compound or an alicyclic diisocyanate compound. Examples of such a diisocyanate compound include 1,3,5-isopropyl-2,4-diisocyanato benzene, naphthalene-1,5-diisocyanate, 2,4-diisocyanato-3,5-diethyltoluene, 4,4'-methylene bis(2,6-diethylphenyl isocyanate), 4,4'-methylene-bis-(2-ethyl-6-methylphenyl isocyanate), 4,4'-methylene-bis-(2-isopropyl-6-methylphenyl isocyanate), 4,4'-methylene-bis-(2,6-diisopropylphenyl isocyanate), 4,4'-methylene-bis-(cyclohexyl isocyanate), 4,4'-methylene-bis-(2-ethyl-6-methylcyclohexyl isocyanate), or an isophorone diisocyanate represented by the following formula (3):

(3)

or a tetramethyl xylilene diisocyanate represented by the following formula (4).

(4)

The diisocyanate compounds may be used either alone or in combination of two or more kinds. In particular, 4,4'-methylene-bis-(cyclohexyl isocyanate), isophorone diisocyanate, and tetramethyl xylilene diisocyanate are preferred.

The particularly preferred polycarbodiimide compound (E) is a polycarbodiimide compound whose main component is one or more kinds selected from 4,4'-methylene-bis-(cyclohexyl isocyanate), isophorone diisocyanate, and tetramethyl xylilene diisocyanate. Herein, the main component is the component contained preferably in an amount of 80 mole % or more of the whole component (composition).

The end of the polycarbodiimide compound (E) may be sealed with a primary or secondary amine, carboxylic acid, acid anhydride, or monoisocyanate. Examples of the monoisocyanate include n-butyl isocyanate, tert-butyl isocyanate, iso-butyl isocyanate, ethyl isocyanate, n-propyl isocyanate, cyclohexyl isocyanate, and n-octadecyl isocyanate. These may be used either alone or in combination of two or more kinds.

The polycarbodiimide compound (E) is blended, to 100 parts by weight of the thermoplastic aromatic polyester (A), in a range of generally 0.01 to 5 parts by weight, preferably 0.05 to 5 parts by weight, and more preferably 0.1 to 2 parts by weight. If the amount of (E) is too much, the melting viscosity may be extremely increased. In order to obtain a preferred resistance to hydrolysis, in particular, it is preferred to blend the (E) in an amount of 0.01 part by weight or more.

{Additives}

The polyester resin composition for coating the flat cable of the present invention may contain, if necessary, additives, so far as the effects of the present invention may not be spoiled. Examples of the additive include another polymer other than the above-mentioned polymers, a plasticizer, an inorganic filler, another flame retardant, a vulcanizing (cross-linking) agent, a pigment, an antioxidant, a photostabilizer, an antistatic agent, an antiblocking agent, a lubricant, a dispersant, a flowability-improver, a parting agent, a nucleating agent, and a neutralizer. The amount of each of these additives or polymers to be added is generally 0.01 to 50 parts by weight, to 100 parts by weight of the polyester resin composition that is used in the present invention.

{Conductors}

Types of conductors for composing the FFC used in the present invention include, for example, copper, a copper alloy, aluminum, and an aluminum alloy. The conductor surface may be subjected to plating with tin, nickel, or the like. The sectional shape of the flat conductor is preferred to be rectangular, and in order to obtain a high heat dissipation, the width of the conductor section is preferred to be 2 times or more the height thereof. Generally, flat conductors each having a rectangular sectional shape are arranged by the required number of cores, at proper intervals so as to keep insulation. In many cases, the number of cores is about 2 to 10.

In the present invention, the "width" of a flat conductor having a rectangular sectional shape means the direction of the flat conductor to be aligned, in the plane orthogonal to the conductor longitudinal direction; and the "height" means the direction orthogonal to the width-wise direction, in the plane orthogonal to the conductor longitudinal direction, that is, the thickness.

{Producing Method}

The polyester resin composition for coating the flat cable of the present invention may be produced by a method of fusing and kneading the components by using an extruder. Some plural components may be fused and kneaded preliminarily. An extruder of any type may be used, and it is preferred to use a biaxial extruder of high kneading performance, in order to enhance the reactivity between functional groups.

The polyester resin composition for coating the flat cable obtained by fusing and kneading by the extruder, is generally cut into pellets by a pelletizer, and the resulting pellets are provided as an insulating coating material for an FFC.

The thus-obtained pellet material is supplied and fused in a uniaxial extruder having cross heads, and flat conductors prepared by the required number of cores are coated in the cross heads, and the FFC is formed by extrusion coating.

The flat cable of the present invention does not generate much corrosive gas when discarded by incineration, and it can be made lighter in weight than the conventional product, and it is preferable as flat cable for a weak electric current or signal to be used in a wiring in automobiles or appliances.

According to the present invention, by enhancing heat resistance of the coating material, the amount of a conductor to be used is saved, and as compared with an electric wire using a round-section conductor, the flat cable sufficiently featuring both light weight and low cost can be provided. Further, the flat cable satisfying a higher degree of flame retardancy can be provided.

The present invention is described in more detail by referring to the following examples, but it must be noted that the present invention is not limited to these examples. Unless otherwise noted, the unit of components for composing the composition is parts by weight.

EXAMPLES

{FFC Evaluating Method}

General basic characteristics to be satisfied by the coating material for an FFC, include flexibility, electrical insulation properties, chemical resistance, resistance to aging by heat, cold resistance, thermal shrinkage, wear resistance, and short-term heat resistance (heat resistance in a short period of time). In addition to the above, flame retardancy or resistance to hydrolysis may be required, in some cases. Further, good contour-extrudability is needed for extrusion-molding of an FFC. The testing and evaluating methods of these properties are briefly explained below.

(1) Flexibility

Resistance to bending was employed as an example of characteristics representing flexibility. The below-mentioned FFC to be tested was folded back, and then crushed under pressure until the thickness of the folded portion of the FFC would become worth two sheets of the FFC in thickness, with no gap left in the folded portion. After the above procedures, when no crack or rupture was occurred in the resulted coating material of the FFC and no conductor was exposed (seen), the resistance to bending, that is, the flexibility, of the sample FFC to be tested, was judged to pass the test, which is designated as "○" in the following Table 1. On the other hand, when any one of these problems was observed, such a case was judged to fail the test, which is designated as "X" in Table 1.

(2) Electrical Insulation Properties

A sample of the FFC was cut out in a length of 350 mm, the coating at both ends of the sample was stripped off in a length of 25 mm each to expose the conductor, and only the coating portion of the sample was immersed in a 3% brine at 23±5° C. for 4 hours, and voltage was applied between the brine and the conductor. When the sample to be tested successfully withstood at 1000 V DC for 1 minute, such a case was judged to pass the test, which is designated as "○" in Table 1. On the other hand, when the sample to be tested could not withstand under the above conditions, such a case was judged to fail the test, which is designated as "X" in Table 1.

(3) Chemical Resistance

As chemicals into which a sample FFC was to be immersed, use was made of gasoline, light oil, ethanol, a battery electrolyte, an engine oil, a power steering fluid (oil), an automatic transmission fluid (ATF), and a coolant.

A sample of the FFC was cut out in a length of 600 mm, the coating at both ends of the sample was stripped off in a length of 25 mm each to expose the conductor, and only the coating portion of the sample was immersed in any one of the chemicals for 20 hours, in the conditions of 23±5° C. for gasoline, light oil, ethanol and a battery electrolyte, and 50±3° C. for an engine oil, a power steering fluid, an automatic transmission fluid (ATF) and a coolant. Then, the test and evaluation were carried out in the same manner as in the above electrical insulation properties (2). When the sample to be tested successfully withstood at 1000 V DC for 1 minute, such a case was judged to pass the test, which is designated as "○" in Table 1. On the other hand, when the sample to be tested could not withstand under the above conditions, such a case was judged to fail the test, which is designated as "X" in Table 1.

(4) Resistance to Aging by Heat

After heat treatment of the FFC sample in the atmosphere of 120° C. for 168 hours, the flexibility test as mentioned in the above (1) was conducted. After the above procedures, when no conductor was exposed or no defective insulation was observed on the sample tested, such a case was judged to pass the test, which is designated as "○" in Table 1. On the other hand, when any one of these problems was observed, such a case was judged to fail the test, which is designated as "X" in Table 1.

(5) Cold Resistance

After cooling the FFC sample in the conditions of minus 40±2° C. for 4 hours, the flexibility test as mentioned in the above (1) was conducted. After the above procedures, when no conductor was exposed or no defective insulation was observed on the sample tested, such a case was judged to pass the test, which is designated as "○" in Table 1. On the other hand, when any one of these problems was observed, such a case was judged to fail the test, which is designated as "X" in Table 1.

(6) Thermal Shrinkage

A sample of the FFC was cut out in a length of 100 mm, and the length of the coating material was measured. Then, the FFC sample was heated for 15 minutes in the atmosphere of 150±3° C., and returned to the atmosphere of 23±5° C., to let it stand for at least 1 hour. The length of the coating material of the resultant sample was measured again. When the sample tested had the thermal shrinkage rate calculated in the following formula of 4% or less, such a case was judged to pass the test, which is designated as "○" in Table 1. On the other hand, when the sample tested had the thermal shrinkage more than 4%, such a case was judged to fail the test, which is designated to "X" in Table 1.

Thermal shrinkage (%)={(Coating material length before heat treatment−Coating material length after heat treatment)/Coating material length before heat treatment}×100

(7) Wear Resistance

Using a testing apparatus to be used in a wear resistance test by a blade reciprocating method for a thin low-voltage electric wire for automobiles, as specified in JASO D611, the coating material surface of the FFC sample of 750 mm in length was abraded by reciprocal motions of blade, over a length of 10 mm in the major axis direction. The number (times) of reciprocal motions until the blade would contact with the conductor was measured. The blade reciprocating speed was 60 times per minute, and a piano wire of 0.45 mm in diameter was used at the blade tip, the force applied to the blade was 7 N, and the measuring temperature was 23° C. When the sample tested had the number of reciprocal motion strokes of the blade of more than 1500 times, such a case was judged to pass the test, which is designated as "○" in Table 1. On the other hand, when the sample tested had the number of reciprocal motion strokes not exceeding 1500 times, such a case was judged to fail the test, which is designated to "X", in Table 1.

(8) Flame Retardancy

Horizontal combustion test was conducted, according to the rubber and plastic insulated wire testing method, as specified in Section 28. of JIS C 3005. The heating source was a Bunsen burner with aperture of 10 mm, the oxidizing flame was adjusted to a length of 130 mm, the reducing flame was adjusted to a length of 35 mm, and the fuel was propane gas of 37 MJ/m$^3$. Horizontally holding the FFC sample having a length of 300 mm, the leading end of the reducing flame was positioned at the lower side of the middle of the sample, and the sample was kept in contact with the flame until combustion started within 30 seconds, and the flame was slowly removed when combustion started. At this time, the duration of time from start of combustion until extinction (quench) was measured and obtained as a horizontal combustion time. Further, 450 combustion time was measured in the same manner as in the horizontal test, except that the wire sample was inclined in an angle by 45°. The shorter the horizontal and 45° combustion times are, the better the flame retardancy is. When the sample tested was extinguished within 15 seconds in horizontal combustion, and within 70 seconds in 45° combustion, such a case was judged to pass the test, which is designated as "○" in Table 1. On the other hand, when combustion of the sample tested could not be extinguished within the above-specified period of time, such a case was judged to fail the test, which is designated to "X" in Table 1.

(9) Resistance to Hydrolysis

A sample of the FFC was cut out in a length of 2.5±0.1 m, the coating at both ends of the sample was stripped off in a length of 25 mm each to expose the conductor, and only the coating portion of the FFC sample was immersed, over 5 weeks, in a 10 g/l brine, at 85° C. During this period of time, a DC voltage of 48 V had been applied continuously between the FFC conductor and the 85° C. brine, to perform the electrical insulation test. After 5 weeks of immersion, the sample was taken out from the brine, and the flexibility was tested in the same manner as in the above (1). After the above procedures, when no conductor was exposed or no defective insulation was observed on the sample tested, such a case was judged to pass the test, which is designated as "○" in Table 1. On the other hand, when any one of these problems was observed, such a case was judged to fail the test, which is designated as "X" in Table 1.

Further, as a method of evaluating a higher degree of resistance to hydrolysis, the sample provided in the same manner as above, was folded back, according to the evaluation method of flexibility in the above (1), and the resulting sample was immersed in a 10 g/l brine, while the sample was kept to be folded. Then, the sample was tested and evaluated in the same manner as above, except for the holding shape. The sample that passed this evaluation test, had the higher degree of resistance to hydrolysis, which is indicated by double circles "◎" in Table 1.

(10) Contour-extrudability (Extrudability)

When coating the conductor with the coating material by using an extrusion-molding die, the contour-extrudability was judged to be excellent, which is indicated by "○" in Table 1, in the case when the resultant FFC sectional shape could highly reproduce the extrusion die shape, i.e. the reproduction of the die shape was high. In addition to the above, utilized also was, as judging factors on contour-extrudability, that the surface of the coating material was smooth and less in surface undulation called as shark skin when observed with the naked eye. On the other hand, when the sample after extrusion was poor in reproduction of the extrusion die shape or poor in surface property, such a case was judged to be poor in the contour-extrudability, which is designated as "X" in Table 1.

(11) Short-term Heat Resistance

The short-term heat resistance is one of the properties that the coating material is required to have, in case of flow of overcurrent, until a fuse or a breaker begins to work to cut off the current. The evaluation was carried out in the following testing manner: the FFC sample of 1000-mm long was used, and the sample was heated at 200° C. for 1000 seconds in each of the Examples and Comparative Examples 3 to 9, or at 180° C. for 1000 seconds in Comparative Examples 1 and 2. Then, the sample after testing was observed whether large deformation in the coating material was caused, or whether the conductor was exposed (seen), or whether short-circuit was caused in part of the adjacent conductors. When none of these problems was observed, such a case was judged to pass the test, which is designated as "○" in Table 1. On the other hand, when any one of these problems was observed, such a case was judged to fail the test, which is designated as "X" in Table 1.

{Polymer Evaluation Methods}

(12) Intrinsic Viscosity

Measured at 35° C. by using a solvent of orthochlorophenol.

(13) Amount of the End (Terminal) Carboxyl Group

Measured at 35° C. in benzyl alcohol.

{Thermoplastic Aromatic Polyester}

The following PBT1 and PBT2 were used as the thermoplastic aromatic polyester.

PBT1:

Poly(tetramethylene terephthalate), manufactured by Teijin Ltd. (the intrinsic viscosity of 1.14 dl/g, the amount of the end carboxyl group of 23 eq/ton)

PBT2:
Poly(tetramethylene terephthalate), manufactured by Teijin Ltd. (the intrinsic viscosity of 0.88 dl/g, the amount of the end carboxyl group of 45 eq/ton)

{Producing Method of the Polyester Block Copolymer}

175 parts of dimethyl isophthalate, 23 parts of dimethyl sebacate, and 140 parts of hexamethylene glycol, were subjected to transesterification reaction in the presence of a dibutyl tin diacetate catalyst, and the resultant esters were polycondensed under reduced pressure, to give an amorphous polyester of intrinsic viscosity of 1.06 and free from absorption peak due to melting of crystal by DSC method. To the thus-obtained polyester, chips of polybutylene terephthalate of intrinsic viscosity of 0.98, which was obtained separetely in the similar manner as in the above polycondensation, were added in an amount of 107 parts after drying, and reaction was further performed for 45 minutes at 240° C., and 0.1 part of phenyl phosphonic acid was added thereto to quench the reaction, to give a polyester block copolymer in a chip shape. The melting point of the polyester block copolymer was 190° C., and the intrinsic viscosity was 0.93.

{Glycidyl Modified Olefin-acrylate Copolymer}

Glycidyl methyl acrylate/ethylene/methyl acrylate, manufactured by Sumitomo Chemical (trade name: Bond First 7M, 6 wt % of the glycidyl methyl acrylate component, 64 wt % of the ethylene component, and 30 wt % of the methyl acrylate component), was used.

{Phosphorus Derivative Flame Retardant}

A resorcinol-type aromatic phosphate ester compound, manufactured by Daihachi Chemical (trade name: PX200), was used.

{Polycarbodiimide Compound}

A polycarbodiimide compound, manufactured by NISSHINBO INDUSTRIES, INC. (trade name: Carbodilite HMV-8CA, the average particle diameter of 1000 μm, the softening temperature of about 70° C., the carbodiimide equivalent of 278), was used.

Examples 1 to 10 and Comparative Examples 4 to 9

The above materials were supplied into a biaxial extruder TEX44 (trade name, manufactured by Japan Steel Works Ltd., screw diameter of 44 mm) at the rate shown in Table 1, and fused and kneaded at a cylinder temperature of 250° C., a discharge rate of 50 kg/hr, and a screw speed of 160 rpm, and the resultant threads were cooled and solidified by a cooling water bath, and then cut into pellets of the polyester resin composition by a cutter. At this time, the Q/N value was 0.31.

Figure 1:
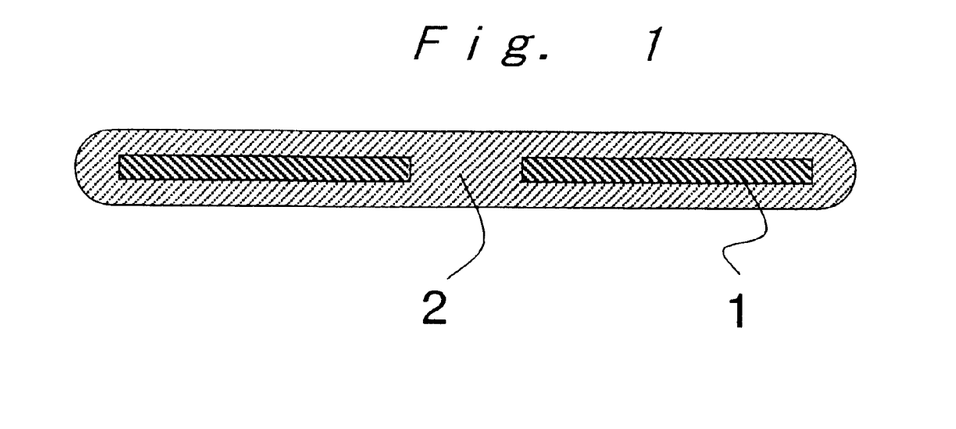
FIG. 1 is a sectional view showing arrangement of conductors and portion coated with a coating material, in an example of the flat cable of the present invention.

Two cores of copper wires, each of which was a rectangular flat conductor (1) of a conductor width of 2.5 mm and a conductor height of 0.15 mm, were arranged to form their sectional shape to be one as shown in FIG. 1, and the above-obtained pellet-shape polyester resin composition was used as a coating material of an insulating coating (2), to provide an FFC of a coating thickness of 0.1 mm by extrusion molding. The properties of the thus-obtained FFC were tested and evaluated in the manner as mentioned above. This extrusion molding was conducted by using the extrusion equipment having cross heads mounted on a 30-mm uniaxial extruder of L/D=22. At this time, the resin temperature immediately after the extrusion die was 230 to 270° C.

Comparative Example 1

An FFC was provided and evaluated in the same manner as in the Example 1, except for using polypropylene, as shown in Table 1. The resin temperature at this time was 180 to 240° C.

Comparative Example 2

An FFC was provided and evaluated in the same manner as in the Example 1, except for using nylon 12, as shown in Table 1. The resin temperature at this time was 200 to 250° C.

Comparative Example 3

A round-section wire, in which a round-section conductor with a sectional area of 0.5 mm$^2$ was used and a 0.3-mm thickness PVC was used as a coating material, was provided, and evaluated in the same manner as in the above. The resin temperature at this time was 160 to 190° C.

The results obtained in the above are also shown in Table 1.

TABLE 1

| | Example 1 | Example 2 | Example 3 | Example 4 | Example 5 | Example 6 | Example 7 | Example 8 | Example 9 | Example 10 |
|---|---|---|---|---|---|---|---|---|---|---|
| PBT 1 | 100 | 100 | 100 | 100 | 100 | 100 | 100 | 100 | 100 | 100 |
| PBT 2 | — | — | — | — | — | — | — | — | — | — |
| Polyester block copolymer | 100 | 100 | 50 | 50 | 50 | 100 | 100 | 100 | 100 | 100 |
| Polycarbodiimide compound | — | — | — | — | — | — | — | — | 1 | — |
| Phosphorus derivative flame retardant | — | 11 | 10 | 13 | 18 | 14 | 17 | 24 | 14 | 50 |
| Glycidyl modified olefin-acrylate copolymer | 10 | 11 | 8 | 9 | 9 | 11 | 11 | 12 | 11 | 13 |
| polypropylene | — | — | — | — | — | — | — | — | — | — |
| nylon 12 | — | — | — | — | — | — | — | — | — | — |
| PVC | — | — | — | — | — | — | — | — | — | — |
| Flexibility | ◯ | ◯ | ◯ | ◯ | ◯ | ◯ | ◯ | ◯ | ◯ | ◯ |
| Electrical insulation properties | ◯ | ◯ | ◯ | ◯ | ◯ | ◯ | ◯ | ◯ | ◯ | ◯ |
| Chemical resistance | ◯ | ◯ | ◯ | ◯ | ◯ | ◯ | ◯ | ◯ | ◯ | ◯ |
| Resistance to aging by heat | ◯ | ◯ | ◯ | ◯ | ◯ | ◯ | ◯ | ◯ | ◯ | ◯ |
| Cold resistance | ◯ | ◯ | ◯ | ◯ | ◯ | ◯ | ◯ | ◯ | ◯ | ◯ |
| Thermal shrinkage | ◯ | ◯ | ◯ | ◯ | ◯ | ◯ | ◯ | ◯ | ◯ | ◯ |
| Wear resistance | ◯ | ◯ | ◯ | ◯ | ◯ | ◯ | ◯ | ◯ | ◯ | ◯ |
| Short-term heat resistance | ◯ | ◯ | ◯ | ◯ | ◯ | ◯ | ◯ | ◯ | ◯ | ◯ |

TABLE 1-continued

| | | | | | | | | | | |
|---|---|---|---|---|---|---|---|---|---|---|
| Extrudability | ○ | ○ | ○ | ○ | ○ | ○ | ○ | ○ | ○ | ○ |
| Flame retardancy | X | X | ○ | ○ | ○ | ○ | ○ | ○ | ◉ | ○ |
| Resistance to hydrolysis | ○ | ○ | ○ | ○ | ○ | ○ | ○ | ○ | ◉ | ○ |

(Note)
"-" means not added

| | Comparative example 1 | Comparative example 2 | Comparative example 3 | Comparative example 4 | Comparative example 5 | Comparative example 6 | Comparative example 7 | Comarative example 8 | Comparative example 9 |
|---|---|---|---|---|---|---|---|---|---|
| PBT 1 | — | — | — | 100 | — | 100 | 100 | 100 | 100 |
| PBT 2 | — | — | — | — | 100 | — | — | — | — |
| Polyester block copoymer | — | — | — | — | 100 | 100 | 100 | 50 | 50 |
| Polycarbodiimide compound | — | — | — | — | — | — | — | — | — |
| Phosphorus derivative flame retardant | — | — | — | — | — | — | 10 | 8 | 12 |
| Glycidy modified olefin-acrylate copolymer | — | — | — | — | — | — | — | — | — |
| polypropylene | 100 | — | — | — | — | — | — | — | — |
| nylon 12 | — | 100 | — | — | — | — | — | — | — |
| PVC | — | — | 100 | — | — | — | — | — | — |
| Flexibility | ND | ND | ND | X | ○ | ○ | ○ | ○ | ○ |
| Electrical insulation properties | ND | ND | ND | ○ | ○ | ○ | ○ | ○ | ○ |
| Chemical resistance | ND | ND | ND | ○ | ○ | ○ | ○ | ○ | ○ |
| Resistance to aging by heat | ND | ND | ND | X | ○ | ○ | ○ | ○ | ○ |
| Cold resistance | ND | ND | ND | X | ○ | ○ | ○ | ○ | ○ |
| Thermal shrinkage | ND | ND | ND | ○ | ○ | ○ | ○ | ○ | ○ |
| Wear resistance | ND | ND | ND | ○ | ○ | ○ | ○ | ○ | ○ |
| Short-term heat resistance | X | X | X | ○ | ○ | ○ | ○ | ○ | ○ |
| Extrudability | ND | ND | ND | X | X | X | X | X | ○ |
| Flame retardant performance | ND | ND | ND | X | X | X | ○ | X | ○ |
| Resistance to hydrolysis | ND | ND | ND | X | X | ○ | ○ | ○ | ○ |

(Note)
"—" means not added
"ND" means not determined

In Table 1, as shown in Example 1, by using the thermoplastic aromatic polyester, the polyester block copolymer, and the olefin-acrylate copolymer modified by a glycidyl compound, as components of the coating material, the contour-extrudability which was insufficient in Comparative Examples 4, 5 and 6 was improved to be excellent, and sufficient electrical properties to be required by an FFC was given. Even in the short-time heat resistance (carried out at 200° C. for 1000 seconds) assuming the short-time passing of overcurrent, the FFC of the Example 1 had sufficient electrical properties to be required by an FFC. Further, this FFC of Example 1 was evaluated in each of the characteristics required by an electric wire, and there was no problem observed.

In the use when a higher flame retardancy is required, as shown in Example 7, a phosphorus derivative flame retardant was added to the composition of Example 1. As a result, in addition to having the sufficient characteristics as an FFC, the FFC of Example 7 could pass both the horizontal combustion test and the 45° combustion test satisfactory. Further, by evaluation of the short-time heat resistance (carried out at 200° C. for 1000 seconds), sufficient characteristics to be required by an FFC were provided even though the fire retardant was utilized in Example 7. By actually carrying out the heating test by feeding power, the degree of temperature rise was Δ25° C. at 10 A and Δ120° C. at 20 A. Hence, at the ambient temperature of 80° C., the FFC of Example 7 can be set an allowable current value of 20 A.

Further, as shown in Examples 3 to 6, 8, and 10 in Table 1, these FFC provided in the same manner as in Example 1, by blending the thermoplastic aromatic polyester, the polyester block copolymer, the olefin-acrylate copolymer modified by a glycidyl compound, and a phosphorus derivative flame retardant, each had sufficient properties including the flame retardancy.

Further, as shown in Example 9, when the polycarbodiimide was further added to the composition of Example 7, a higher degree of the resistance to hydrolysis was recognized.

On the other hand, using components shown in the Comparative Example 4 as a coating material, an FFC was extruded and molded in the same manner as in Example 1, by using two cores of flat conductors with a section of 2.5 mm width×0.15 mm height, but the surface of the resulting coating material was shark skin with observation with the naked eye, the reproducibility of an extrusion die shape was poor, and the contour-extrudability was insufficient. When the flexibility was evaluated, the sample in Comparative Example 4 lacked in pliability, and when the FFC was folded back, the coating was broken, to show insufficient flexibility. Further, using components shown in Comparative Example 5, as a coating material, an FFC was provided in the same manner as in Example 1, but the sectional shape was not formed as desired, and the contour-extrudability was poor. However, since the elongation of the coating material itself was very high, the product in Comparative Example 5 was very pliable and was not associated with problems such as broken when folded back, and the flexibility was sufficient. The chemical resistance and other properties were evaluated, but no problem was noted. On the other hand, as shown in Comparative Example 6, an FFC was extruded and molded in the same manner as in Example 1, except for using a coating material not containing any component of the olefin-acrylate copolymer modified by a glycidyl compound. However, the contour-extrudability in Comparative Example 6 was not satisfactory, as compared with Example 1.

Figure 2:
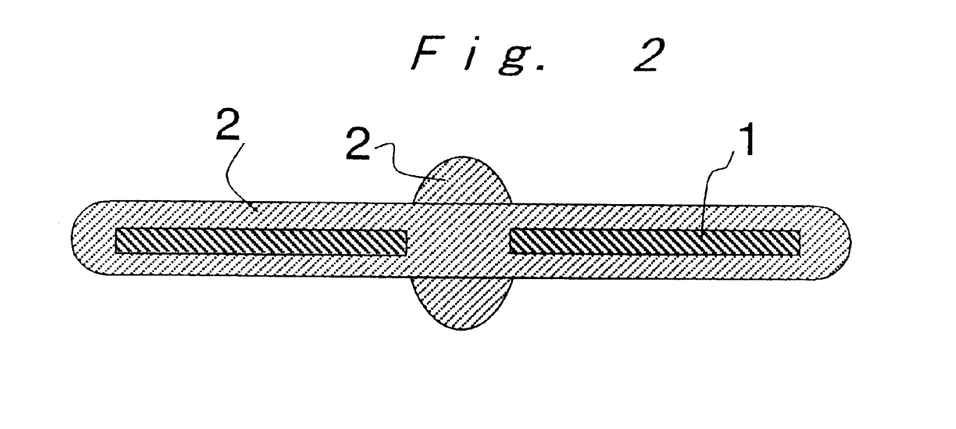
FIG. 2 is a sectional view showing the results of sectional shape relating to contour-extrudability obtained in the following Comparative Examples 7 and 8.

As shown in Comparative Example 7, by further adding a phosphorus derivative flame retardant to Comparative Example 6, a similar FFC was fabricated and evaluated in the same manner as in Example 1, and improvement in flame retardancy was confirmed. However, the contour-extrudability was as poor as in Comparative Example 6, that is, in spite of using the extrusion die conforming to the shape in FIG. 1, the sectional shape of the FFC in Comparative Example 7 resulted to be the shape as shown in FIG. 2. In FIG. 2, the members having the same reference numerals as in FIG. 1 show those of the same meanings.

As compared with the thermoplastic aromatic polyester, the polyester block copolymer is higher in cost. Accordingly, the blending amount of the polyester block copolymer was decreased to 50 parts by weight in order to reduce the cost, as shown in Comparative Example 8, and a similar FFC was fabricated in the same manner as in Example 1. As a result, the sample in Comparative Example 8 was poor in the contour-extrudability similarly in Comparative Example 7, and, in addition, the flame retardancy was not satisfactory. In Comparative Example 9, the content of the phosphorus derivative flame retardant was further increased, and the flame retardancy was satisfactory and there was no problem in other characteristics, except that the contour-extrudability was not satisfactory, similar to in Comparative Examples 7 and 8.

Further, as is apparent from Table 1, polypropylene and nylon 12 used in Comparative Examples 1 and 2, respectively, resulted such problems that the coating material was largely deformed by heating of 180° C.×1000 seconds, that the conductor was exposed after heating, or that a part of the adjacent conductors were caused short-circuit. In Comparative Example 3, in the case of the conductor having a round section, in spite of the conductor sectional area larger than in the flat conductor used in Example 1 (2.5 mm width×0.15 mm height=0.375 mm$^2$), the temperature elevated by 30° C. at 10 A and 130° C. at 20 A. Further, since the heat resistance temperature of the PVC used as the insulating coating material was low, it was forced to set the allowable current value at a smaller value than in the FFC of Example 1.

According to the above, it can be understood that, as compared with the Comparative Examples 1 to 9, the samples in Examples 1 to 9 within the scope of the present invention were superior in flexibility, electrical insulation properties, chemical resistance, resistance to aging by heat, cold resistance, thermal shrinkage, wear resistance, and short-term heat resistance, and also had excellent contour-extrudability, further, in addition to these, they could be improved in flame retardancy and resistance to hydrolysis, thus the samples according to the present invention had useful properties as a coating material of an FFC. It can be also understood that the flat conductors were superior in heat dissipation and they were preferably much smaller in the temperature rise at the same current value, as compared to round-section conductors.

Having described our invention as related to the present embodiments, it is our intention that the present invention not be limited by any of the details of the description, unless otherwise specified, but rather be construed broadly within its spirit and scope as set out in the accompanying claims.

What is claimed is:

1. A flat cable, having an insulating coating composed of a polyester resin composition, the composition comprising:

(A) 100 parts by weight of a thermoplastic aromatic polyester;

(B) 10 to 120 parts by weight of a polyester block copolymer composed of: 20 to 80 wt % of a hard segment whose main component is poly (tetramethylene terephthalate) that is composed of an acid component in which terephthalic acid occupies 60 mole % or more and a diol component in which tetramethylene glycol occupies 60 mole % or more; and 80 to 20 wt % of a soft segment whose main component is a polyester that is composed of an acid component in which an aromatic dicarboxylic acid occupies 60 mole % or more and a diol component of a long-chain diol having 5 to 12 carbon atoms; and (C) 1 to 50 parts by weight of an olefin-acrylate copolymer modified by a glycidyl compound.

2. The flat cable according to claim 1, wherein the polyester resin composition further comprises:

(D) 1 to 100 parts by weight of a phosphorus derivative flame retardant.

3. The flat cable according to claim 2, wherein the polyester resin composition further comprises:

(E) 0.01 to 5 parts by weight of a polycarbodiimide compound.

4. The flat cable according to claim 1, wherein the polyester resin composition further comprises:

(E) 0.01 to 5 parts by weight of polycarbodiimide compound.

* * * * *